(12) United States Patent
Compton et al.

(10) Patent No.: US 12,055,927 B2
(45) Date of Patent: Aug. 6, 2024

(54) THERMAL METAMATERIAL FOR LOW POWER MEMS THERMAL CONTROL

(71) Applicant: Honeywell International Inc., Charlotte, NC (US)

(72) Inventors: Robert Compton, Loretto, MN (US); Chad Fertig, Bloomington, MN (US); Jeffrey James Kriz, Eden Prairie, MN (US)

(73) Assignee: Honeywell International Inc., Charlotte, NC (US)

( * ) Notice: Subject to any disclaimer, the term of this patent is extended or adjusted under 35 U.S.C. 154(b) by 707 days.

(21) Appl. No.: 17/187,296

(22) Filed: Feb. 26, 2021

(65) Prior Publication Data

US 2022/0276615 A1 Sep. 1, 2022

(51) Int. Cl.
*G05B 6/02* (2006.01)
*B81B 3/00* (2006.01)
*F28F 13/00* (2006.01)

(52) U.S. Cl.
CPC .............. *G05B 6/02* (2013.01); *B81B 3/0021* (2013.01); *F28F 13/00* (2013.01);
(Continued)

(58) Field of Classification Search
CPC ... B81B 3/0021; B81B 3/0081; B81B 7/0093; B81B 7/02; B81B 2201/01; B81B 2201/018; B81B 2203/019; B81B 2203/058; B81B 2203/0118; B81B 2203/05; B81B 2203/0181;
(Continued)

(56) References Cited

U.S. PATENT DOCUMENTS

| 6,768,412 B2 | 7/2004 | Becka et al. |
| 7,034,375 B2 | 4/2006 | Kang |

(Continued)

FOREIGN PATENT DOCUMENTS

WO WO-2007110928 A1 * 10/2007 ........... B81B 3/0059

OTHER PUBLICATIONS

European Patent Office, "Extended European Search Report from EP Application No. 22156344.8", from Foreign Counterpart to U.S. Appl. No. 17/187,296, filed Jul. 8, 2022, pp. 1 through 7, Published: EP.

*Primary Examiner* — Ida M Soward
(74) *Attorney, Agent, or Firm* — Fogg & Powers LLC

(57) ABSTRACT

A thermal metamaterial device comprises at least one MEMS thermal switch, including a substrate layer including a first material having a first thermal conductivity, and a thermal bus over a first portion of the substrate layer. The thermal bus includes a second material having a second thermal conductivity higher than the first thermal conductivity. An insulator layer is over a second portion of the substrate layer and includes a third material that is different from the first and second materials. A thermal pad is supported by a first portion of the insulator layer, the thermal pad including the second material and having an overhang portion located over a portion of the thermal bus. When a voltage is applied to the thermal pad, an electrostatic interaction occurs to cause a deflection of the overhang portion toward the thermal bus, thereby providing thermal conductivity between the thermal pad and the thermal bus.

17 Claims, 7 Drawing Sheets

(52) U.S. Cl.
CPC ..... *B81B 2201/01* (2013.01); *B81B 2201/018* (2013.01); *B81B 2203/0181* (2013.01); *B81B 2203/019* (2013.01); *B81B 2203/05* (2013.01); *B81B 2203/058* (2013.01); *B81B 2207/01* (2013.01); *B81B 2207/053* (2013.01); *F28F 2013/008* (2013.01)

(58) Field of Classification Search
CPC .. B81B 2207/01; B81B 2207/53; F28F 13/00; F28F 2013/088
See application file for complete search history.

(56) References Cited

U.S. PATENT DOCUMENTS

| | | | |
|---|---|---|---|
| 7,342,472 B2 * | 3/2008 | Charvet | H01H 1/0036 335/78 |
| 7,745,747 B2 * | 6/2010 | Carmona | H01H 59/0009 335/78 |
| 7,834,722 B2 * | 11/2010 | Millet | B81B 5/00 335/78 |
| 8,081,371 B2 * | 12/2011 | Sugimoto | H04N 9/3105 359/223.1 |
| 8,186,221 B2 * | 5/2012 | Lin | G01P 15/0802 73/514.32 |
| 8,638,093 B2 | 1/2014 | Aimi et al. | |
| 9,028,138 B2 | 5/2015 | Ben Jamaa et al. | |
| 10,114,212 B2 * | 10/2018 | Aoyagi | G02B 26/0841 |
| 10,749,539 B2 | 8/2020 | Kriz et al. | |
| 2003/0007720 A1 * | 1/2003 | Staple | B81B 3/0016 359/872 |
| 2004/0040828 A1 * | 3/2004 | Ivanciw | H01H 47/04 200/600 |
| 2004/0061579 A1 * | 4/2004 | Nelson | H01H 59/0009 335/78 |
| 2004/0085606 A1 * | 5/2004 | Valette | B81B 3/0062 359/224.1 |
| 2004/0219706 A1 | 11/2004 | Wan | |
| 2008/0173091 A1 * | 7/2008 | McNeil | G01P 15/125 73/514.32 |
| 2008/0190748 A1 | 8/2008 | Arthur et al. | |
| 2008/0250785 A1 | 10/2008 | Carlson et al. | |
| 2009/0293616 A1 * | 12/2009 | Lin | G01P 21/00 73/514.32 |
| 2010/0039208 A1 | 2/2010 | Epstein et al. | |
| 2010/0055841 A1 * | 3/2010 | Ozawa | B81B 7/0051 257/E21.499 |
| 2010/0107763 A1 * | 5/2010 | Lin | G01P 15/18 73/514.32 |
| 2012/0015456 A1 | 1/2012 | Thompson et al. | |
| 2016/0334438 A1 * | 11/2016 | Thompson | B81B 3/0086 |
| 2020/0217597 A1 | 7/2020 | Phoenix | |

* cited by examiner

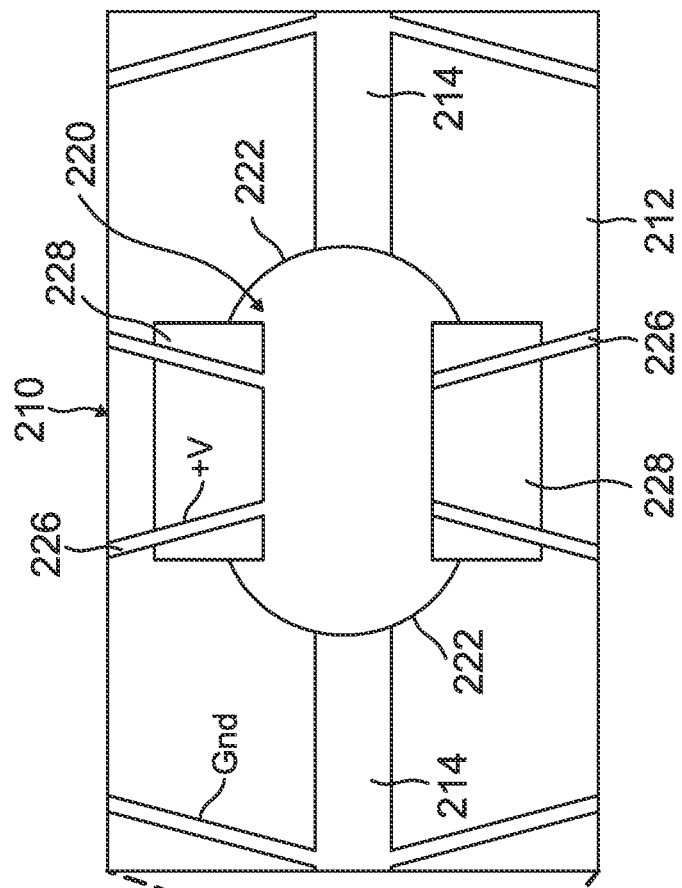
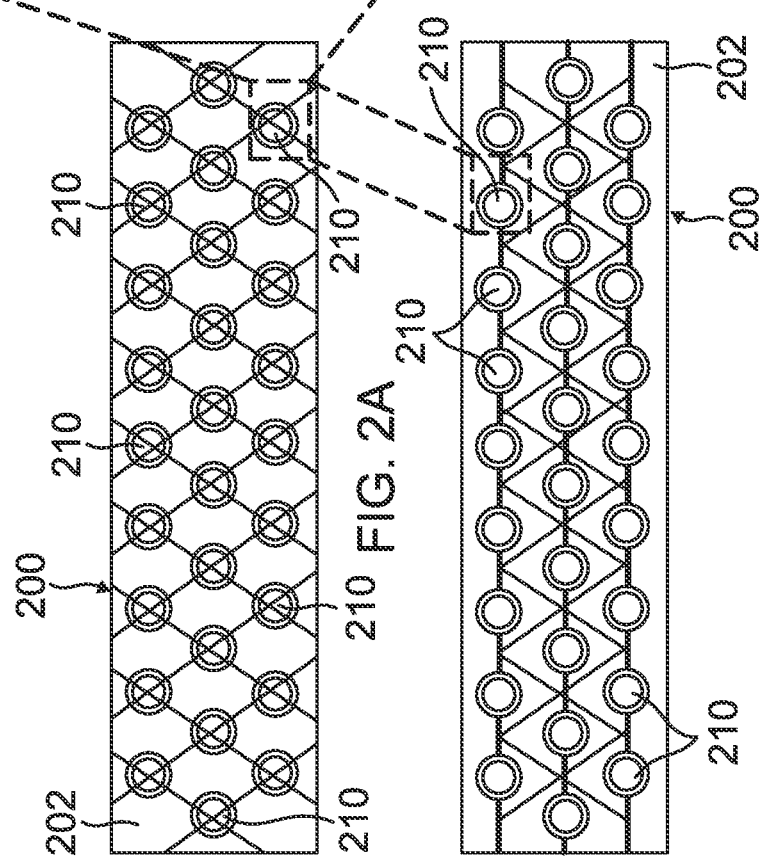

THERMAL METAMATERIAL FOR LOW POWER MEMS THERMAL CONTROL

BACKGROUND

Many types of micro-electro-mechanical systems (MEMS) sensors and atomic sensors have errors that depend on temperature. For operation over a typical military temperature range, for example from −40° C. to 85° C., errors can be minimized by controlling the temperature of the sensor, such as by heating or cooling the sensor.

Heating is easily accomplished by electronic resistivity, which can be incorporated into a MEMS sensor or atomic sensor by lithographic patterning of the appropriate resistive circuit. Cooling is more difficult to accomplish, since conventional devices, such as thermo-electric cooling devices, are very inefficient and introduce strong thermally conductive coupling to the environment, which also decreases the efficiency of the resistive heating elements.

SUMMARY

A thermal metamaterial device comprises at least one micro-electro-mechanical systems (MEMS) thermal switch. The MEMS thermal switch comprises a substrate layer including a first material having a first thermal conductivity, and a thermal bus over a first portion of the substrate layer, the thermal bus including a second material having a second thermal conductivity that is higher than the first thermal conductivity. An insulator layer is over a second portion of the substrate layer, the insulator layer including a third material that is different from the first and second materials. The insulator layer includes a first portion having a first height, and a second portion having a second height that is less than the first height. A thermal pad is supported by the first portion of the insulator layer, the thermal pad including the second material and having an overhang portion located over a portion of the thermal bus. When a voltage is applied to the thermal pad, an electrostatic interaction occurs between the thermal pad and the thermal bus to cause a deflection of the overhang portion of the thermal pad toward the thermal bus, thereby providing thermal conductivity between the thermal pad and the thermal bus.

BRIEF DESCRIPTION OF THE DRAWINGS

Features of the present disclosure will be apparent to those skilled in the art from the following description with reference to the drawings. Understanding that the drawings depict only typical embodiments and are not therefore to be considered limiting in scope, the embodiments will be described with additional specificity and detail through the use of the drawings, in which:

FIG. 2A is a schematic top view of a thermal metamaterial having an array of MEMS thermal switches, according to one embodiment;

FIG. 2B is a schematic bottom view of the thermal metamaterial of FIG. 2A;

FIG. 2C is an enlarged top view of a section of the thermal metamaterial of FIG. 2A;

DETAILED DESCRIPTION

In the following detailed description, reference is made to the accompanying drawings, in which is shown by way of illustration various exemplary embodiments. It is to be understood that other embodiments may be utilized. The following detailed description is, therefore, not to be taken in a limiting sense.

A thermal metamaterial for low power micro-electro-mechanical systems (MEMS) thermal control is described herein. The thermal metamaterial can be implemented in various embodiments to have a variable thermal conductivity.

The present approach incorporates a multiplicity of thermal switches that can be actuated by various possible mechanisms (e.g., electrostatic, piezo-electric, thermal bimetallic, and the like) in order to decrease the effective thermal conductivity of a material through which the MEMS sensor or atomic sensor is heat sinked. This provides efficient cooling when ambient temperature is high, without sacrificing efficient heating capability when ambient temperature is low. In some cases, such as use in chip-scale atomic clocks, the present approach can be incorporated into an existing fabrication process flow, with only minor additional changes, so that the benefit can be obtained with minimal additional cost.

The present devices provide an improved coefficient of thermal conductivity by an order of magnitude relative to prior approaches, by stabilizing the temperature of various electronic components. Because of their internal heat load, these electronic components need to be actively or passively cooled in order to operate at high ambient temperatures. The present approach enables efficient passive cooling of such components.

In one embodiment, the thermal metamaterial is based on metallic cantilevers that can be actuated by one of several possible mechanisms. In one implementation, the thermal metamaterial can be lithographically patterned into existing support structure for MEMS devices such as chip-scale atomic clocks, in which miniature components are supported on miniature thermally isolated platforms (i.e., scaffolds). For example, these parts can be fabricated in a batch process from wafers (e.g., silicon wafers), with hundreds of scaffolds per wafer incorporating the thermal metamaterial devices.

Further details of various embodiments are described hereafter with reference to the drawings.

Figure 1A:
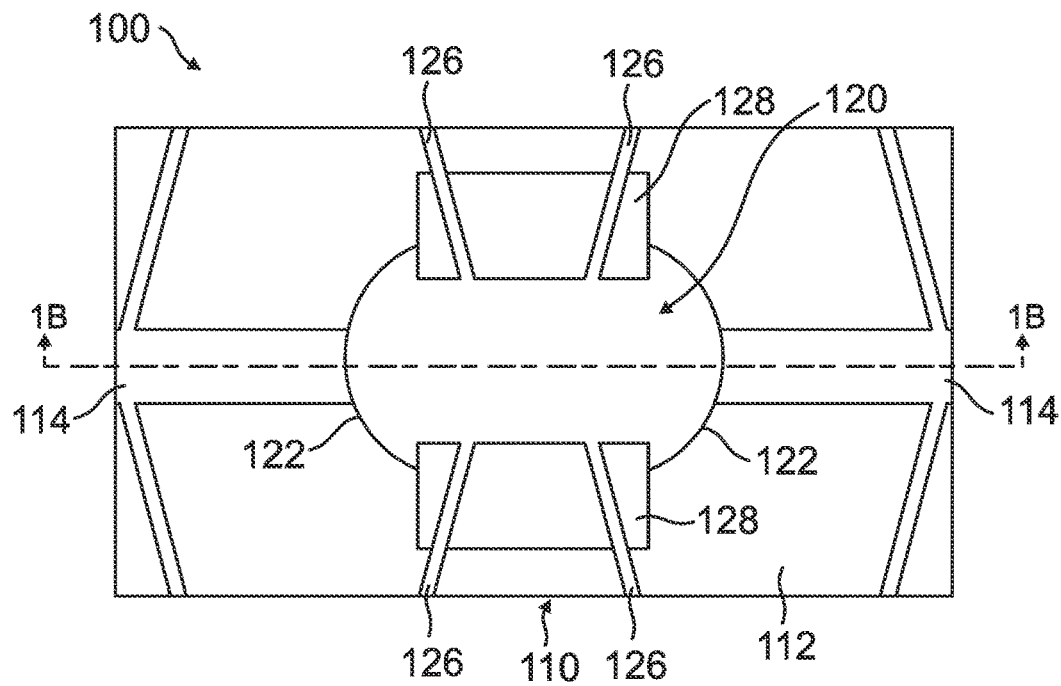
FIG. 1A is a schematic top view of a section of a thermal metamaterial, which includes a micro-electro-mechanical systems (MEMS) thermal switch, according to one embodiment.
Figure 1B:
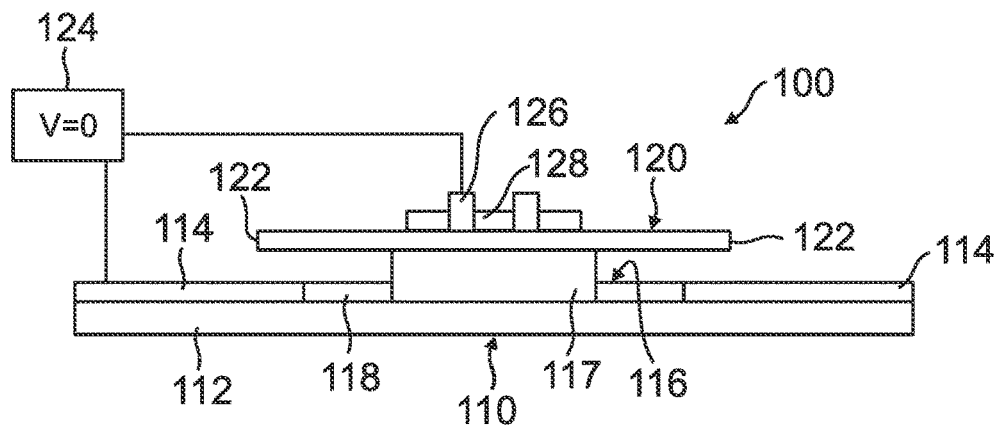
FIGS. 1B and 1C are schematic side views of the section of the thermal metamaterial of FIG. 1A, which includes the MEMS thermal switch.
Figure 1C:
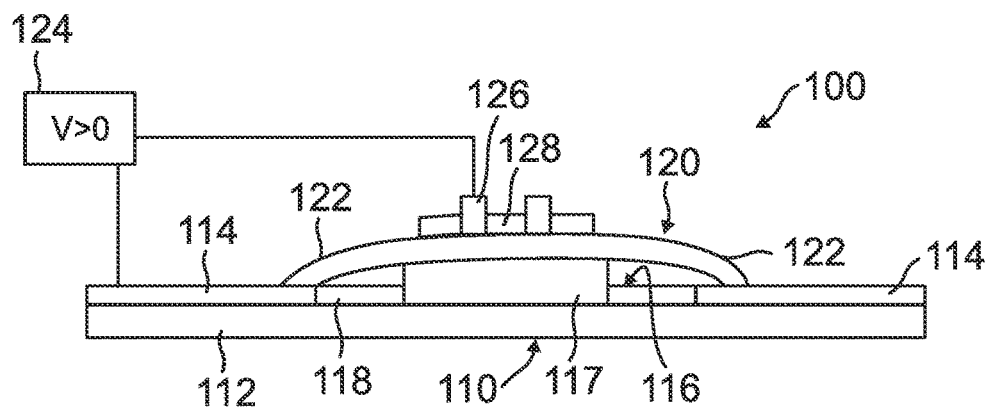

FIG. 1A-1C illustrate different views of a section of a thermal metamaterial 100, which includes at least one MEMS thermal switch 110, according to one embodiment. The MEMS thermal switch 110 can be implemented as an array of thermal switches in thermal metamaterial 100, as described further hereafter. The thermal metamaterial 100 can be formed on a thermally isolated platform, such as a scaffold that is thermally isolated from a surrounding environment, as described further hereafter.

The MEMS thermal switch 110 includes a substrate layer 112 comprising a first material having a first thermal conductivity. For example, the first material can be a lower thermal conductivity material such as a polyimide, porous silicon, a glass, combinations thereof, or the like.

A thermal bus 114 is formed over a first portion of substrate layer 112 and can be connected to ground. The thermal bus 114 includes a second material having a second thermal conductivity that is higher than the first thermal conductivity. For example, the second material can be a metal, such as copper, gold, aluminum, combinations thereof, or the like.

An insulator layer 116 (FIGS. 1B and 1C) is formed over a second portion of substrate layer 112. The insulator layer 116 includes a first portion 117 having a first height (e.g., mesa portion), and a second portion 118 having a second height that is less than the first height. The insulator layer 116 includes a third material that is different from the first and second materials. For example, the third material can be an oxide or nitride material, such as silicon dioxide, silicon nitride, combinations thereof, or the like.

A thermal pad 120 is supported by first portion 117 of insulator layer 116. The thermal pad 120 includes the second material having a higher thermal conductivity, and has an overhang portion 122. The overhang portion 122 is located over a portion of thermal bus 114.

A voltage source 124 (FIGS. 1B and 1C) is electrically coupled to thermal pad 120, such as through one or more metallic contacts 126. A pair of support sections 128 are coupled over thermal pad 120, with support sections 128 including the first material having a lower thermal conductivity. The metallic contacts 126 are coupled to support sections 128.

As shown in FIG. 1B, when the voltage is zero, overhang portion 122 of thermal pad 120 remains undeflected toward thermal bus 114. This provides a low thermal conductivity between thermal pad 120 and thermal bus 114. As shown in FIG. 1C, when the voltage applied to thermal pad 114 is greater than zero, overhang portion 122 deflects toward thermal bus 114, because of an electrostatic interaction that occurs between thermal pad 120 and thermal bus 114. This provides a high thermal conductivity between thermal pad 120 and thermal bus 114.

In one embodiment, a voltage control for voltage source 124 can be unipolar (+V to ground). In another embodiment, the voltage control can be bipolar (+V to −V). In an alternative embodiment, described further hereafter, a variable temperature control can be provided by using pulse width modulation (PWM). Using PWM allows for intermittent connection to provide for continuous tuning of thermal conductivity of the thermal metamaterial.

FIGS. 2A and 2B respectively illustrate top and bottom views of a thermal metamaterial 200 having an array of MEMS thermal switches 210, according to an exemplary embodiment. The thermal metamaterial 200 can be formed on a thermally isolated platform 202, such as a scaffold, so that thermal metamaterial 200 is thermally isolated from a surrounding environment.

FIG. 2C is an enlarged top view of a section of thermal metamaterial 200, illustrating one of MEMS thermal switches 210. Each of MEMS thermal switches 210 has a structure similar to MEMS thermal switch 110 described above. As such, each MEMS thermal switch 210 includes a substrate layer 212 comprising a first material having a lower thermal conductivity, such as a polyimide.

A thermal bus 214 is formed over a first portion of substrate layer 212 and can be connected to ground. The thermal bus 214 includes a second material having a higher thermal conductivity, such as copper.

An insulator layer is formed over a second portion of substrate layer 212, such as insulator layer 116 (FIGS. 1B and 1C), which includes a first portion 117 having a first height and a second portion 118 having a second height that is less than the first height. The insulator layer includes a third material that is different from the first and second materials. For example, the third material can be silicon dioxide.

A thermal pad 220 is supported by the first portion of the insulator layer. The thermal pad 220 includes the second material having a higher thermal conductivity (e.g., copper), and has an overhang portion 222. The overhang portion 222 is located over a portion of thermal bus 214.

A voltage source is electrically coupled to thermal pad 220, such as through one or more metallic contacts 226, such as copper contacts. A pair of support sections 228 are coupled over thermal pad 220, with support sections 228 including the first material having a lower thermal conductivity (e.g., polyimide). The metallic contacts 226 are coupled with support sections 228.

The MEMS thermal switches 210 operate in a similar manner as described above for MEMS thermal switch 110. Accordingly, when the voltage is zero, overhang portion 222 of thermal pad 220 remains undeflected toward thermal bus 214. This provides a low thermal conductivity between thermal pad 220 and thermal bus 214. When the voltage applied to thermal pad 214 is greater than zero, overhang portion 222 deflects toward thermal bus 214, which provides a high thermal conductivity between thermal pad 220 and thermal bus 214.

As described further hereafter, a variable temperature control can be provided by using a PWM process, which allows for intermittent connection to provide for continuous tuning of the thermal conductivity of thermal metamaterial 200.

Figure 3A:
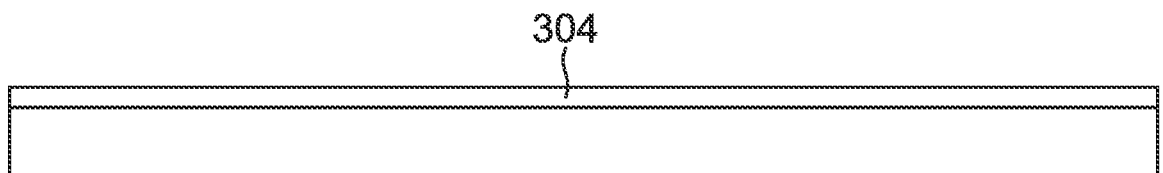
FIGS. 3A-3K are schematic side views of a method for fabricating a MEMS device, which includes a thermal metamaterial, according to an exemplary approach.
Figure 3B:
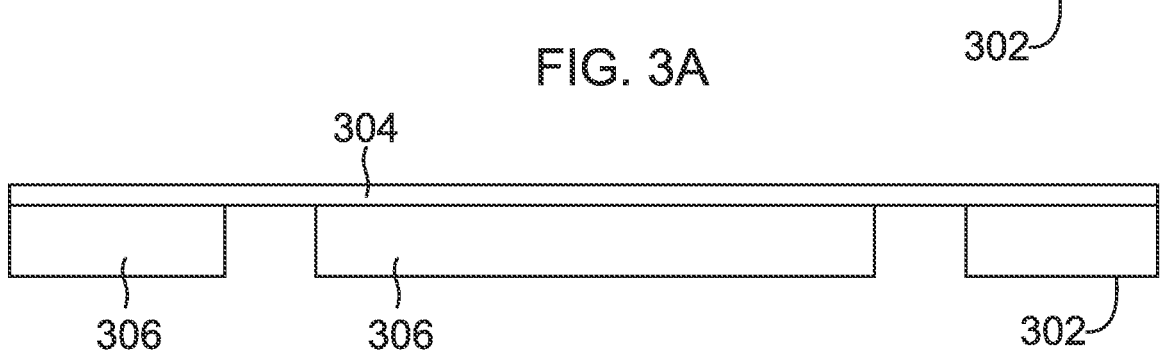

FIGS. 3A-3K illustrate schematic side views of a method for fabricating a MEMS device, which includes a thermal metamaterial such as described above, according to an exemplary approach. Initially, as shown FIG. 3A, a substrate layer 302 is provided such as a wafer, which is composed of a higher thermal conductivity material, such as silicon. A first polymer layer 304 is formed on substrate layer 302. The first polymer layer 304 is composed of a lower thermal conductivity material, such as a polyimide. As depicted in FIG. 3B, substrate layer 302 is etched to create island portions 306 that are bridged by first polymer layer 304. In one embodiment, substrate layer 302, island portions 306, and first polymer layer 304 can be formed as part of a thermal isolation scaffold.

Figure 3C:
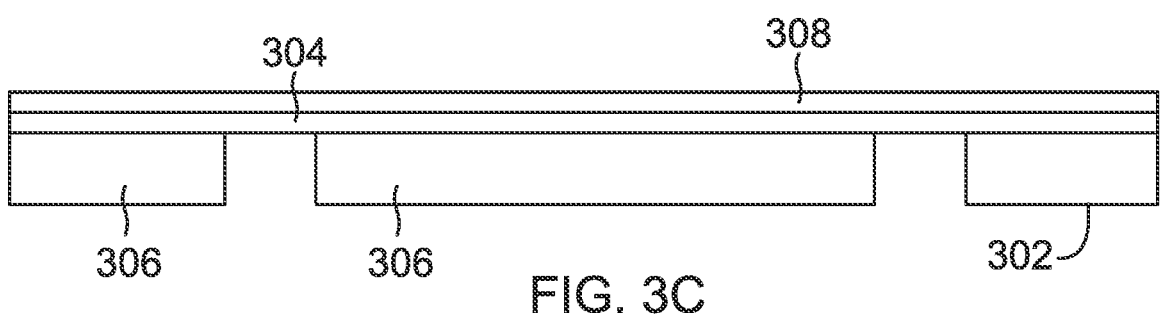
Figure 3D:
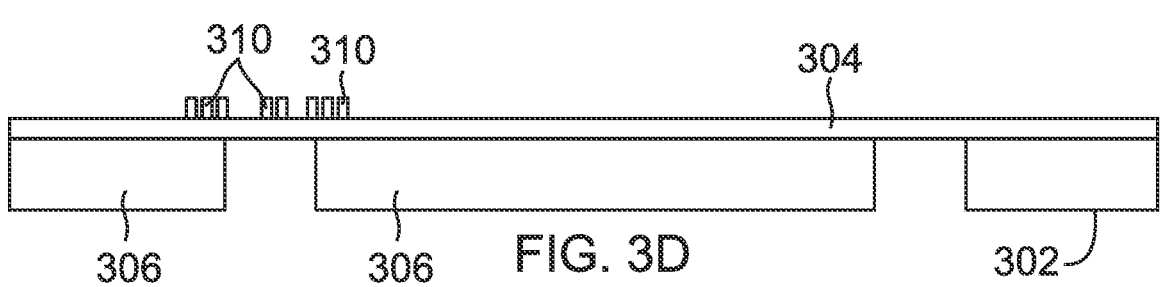

As shown in FIG. 3C, a first metal layer 308 is deposited on first polymer layer 304, such as by an electron beam (e-beam) or sputtering process. The first metal layer 308 can be composed of copper, gold, or aluminum, for example. Next, first metal layer 308 is patterned, such as by a wet etching or ion milling process, to produce thermal bus portions 310 that protrude from first polymer layer 304, as shown in FIG. 3D.

Figure 3E:
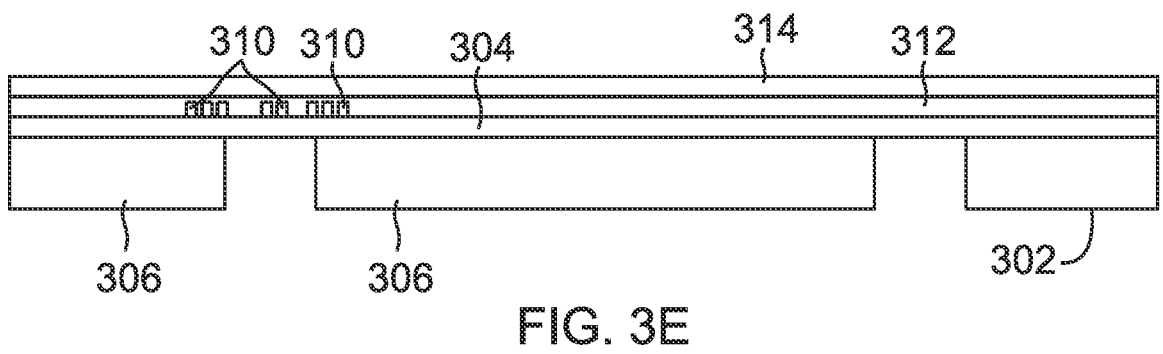
Figure 3F:
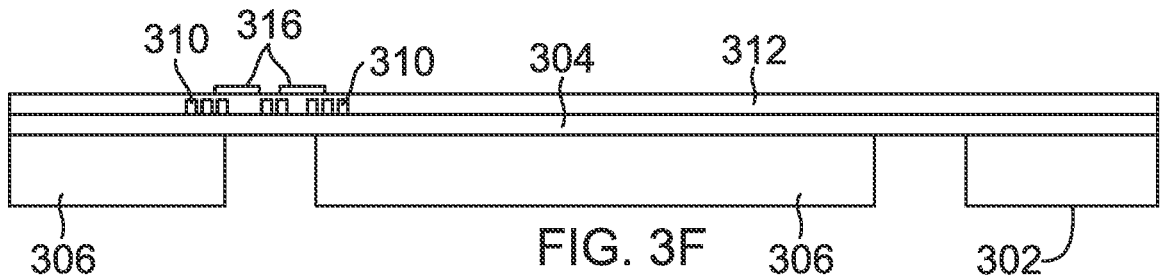

Thereafter, as illustrated in FIG. 3E, an insulator layer 312 is formed over thermal bus portions 310 and exposed portions of first polymer layer 304, such as by a chemical vapor deposition (CVD) or sputtering process. The insulator layer 312 can be composed of silicon dioxide or silicon nitride, for example. Thereafter, a second metal layer 314 (e.g., copper or gold) is deposited over insulator layer 312, such as by an e-beam or sputtering process. The second metal layer 314 is then patterned, such as by a wet etching or ion milling process, to produce a set of electrode pads 316 that protrude from insulator layer 312, as shown in FIG. 3F.

Figure 3G:
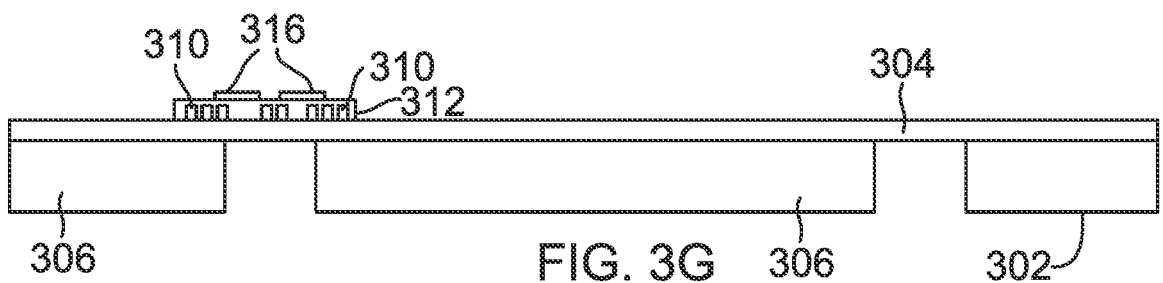
Figure 3H:
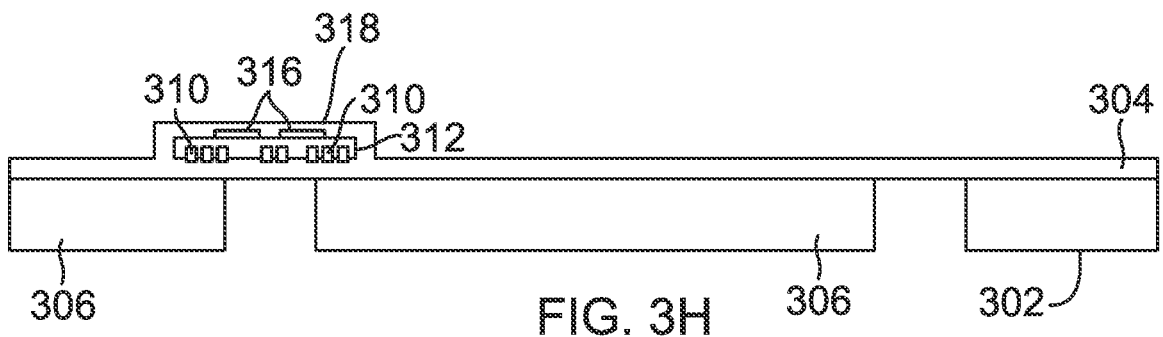

As depicted in FIG. 3G, insulator layer 312 is partially etched, to prepare for the formation of top electrical contacts, which exposes portions of an upper surface of first polymer layer 304. As shown in FIG. 3H, a second polymer layer 318 (e.g., polyimide) is formed over exposed surface portions, including electrode pads 316, insulator layer 312, and first polymer layer 304, such as by a spinning process.

Figure 3I:
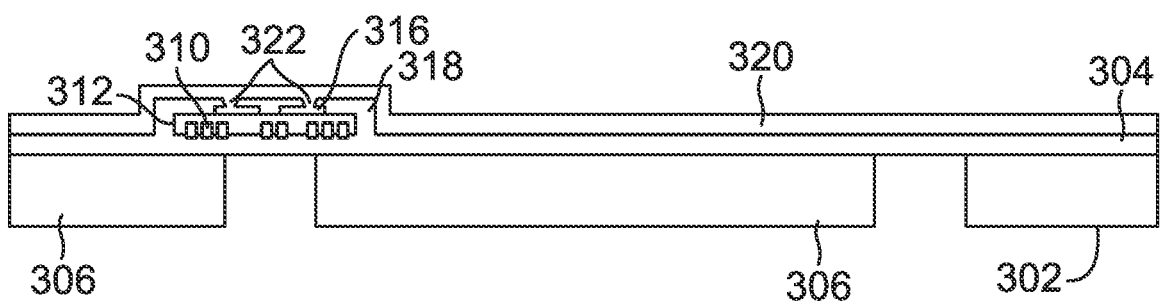
Figure 3J:
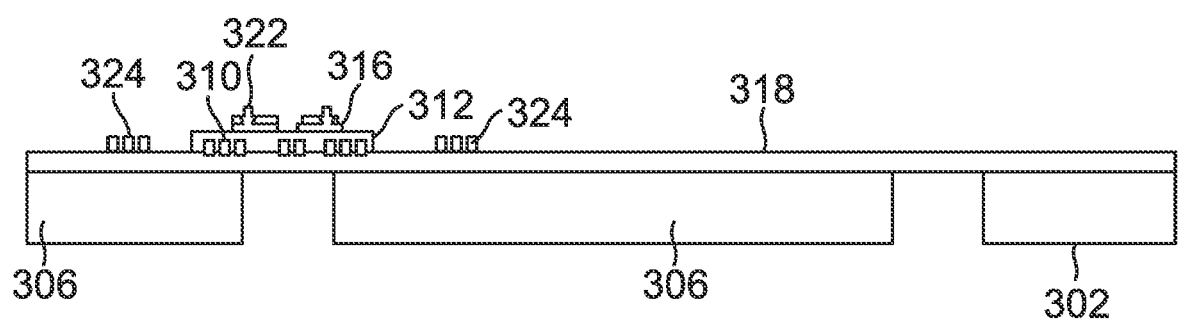
Figure 3K:
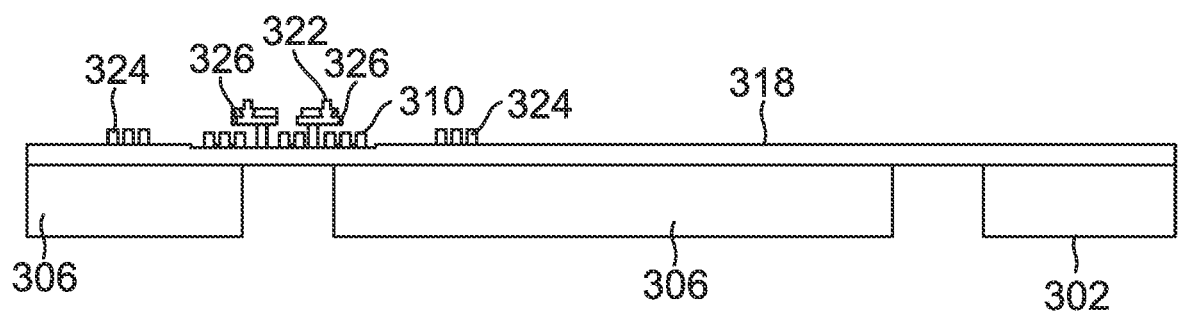

Next, as shown in FIG. 3I, second polymer layer 318 over electrode pads 316 is etched, and a third metal layer 320 (e.g., copper or gold) is deposited over second polymer layer 318 to create a set of upper contacts 322. As shown in FIG. 3J, third metal layer 320 is etched along with portions of second polymer layer 318 to create an upper metal grid pattern 324. Thereafter, as illustrated in FIG. 3K, insulator layer 312 is partially etched, such as by wet etching, to undercut electrode pads 316, to produce a set of thermal pads 326 supported by raised portions of insulator layer 312.

Thereafter, an upper polymer layer, such as a polyimide layer, can be optionally formed over the fabricated structure of the thermal metamaterial, such as by a spinning process. The foregoing method can be employed in a batch fabrication process to produce the thermal metamaterial.

As mentioned previously, the thermal metamaterial can be formed onto support structures for miniature devices such as chip-scale atomic clocks, in which miniature components are supported on miniature thermally isolated scaffolds. These structures can be fabricated in a batch process from wafers, with hundreds of scaffolds per wafer incorporating the thermal metamaterial.

Figure 4:
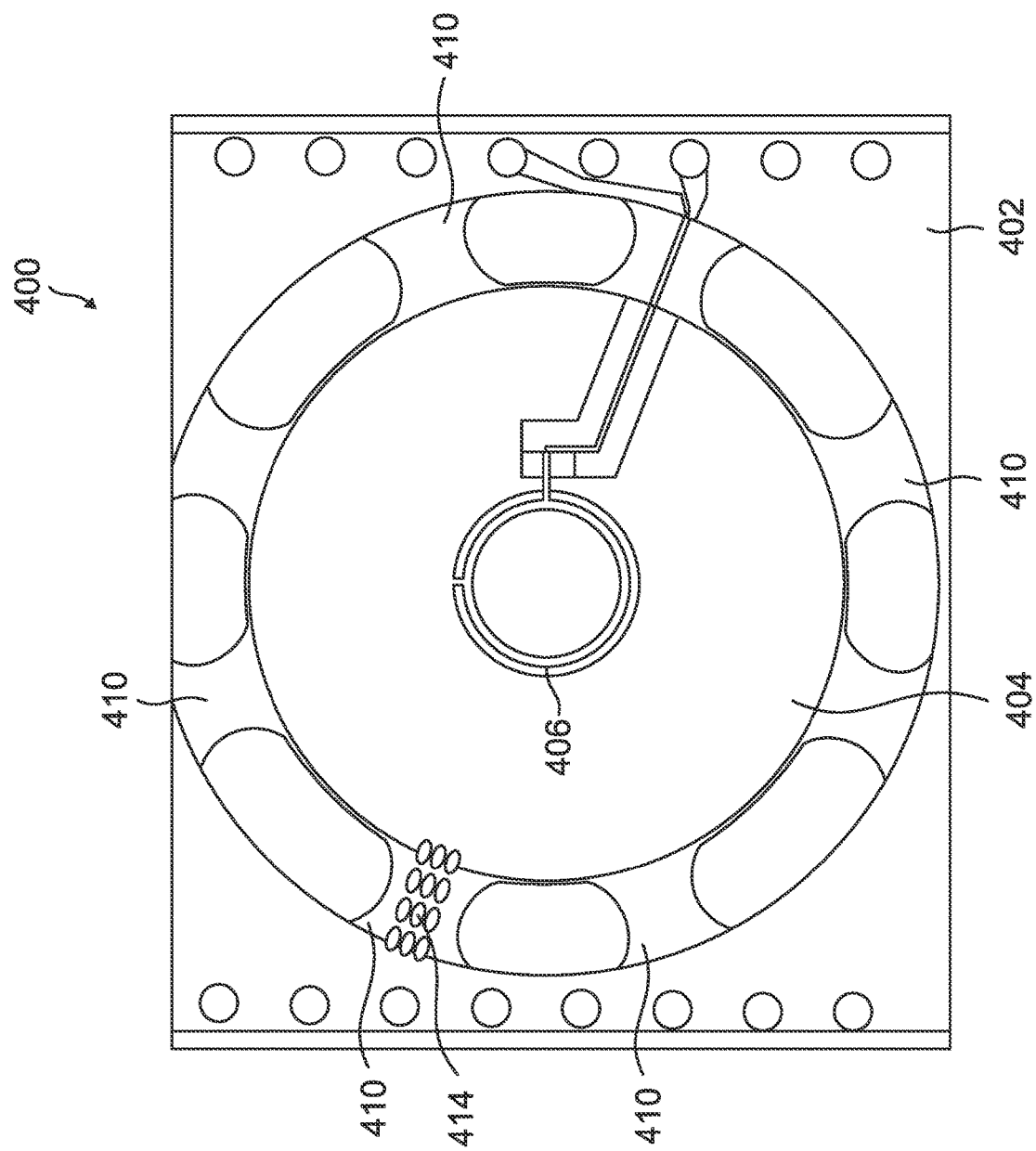
FIG. 4 illustrates a thermal isolation scaffold, which can be implemented with a thermal metamaterial, according to exemplary embodiment.

FIG. 4 illustrates such a thermal isolation scaffold 400, which can be implemented with a thermal metamaterial, according to one embodiment. The thermal isolation scaffold 400 includes a substrate 402, such as a silicon substrate, and an island portion 404, such as a silicon island, which is thermally isolated from and surrounded by substrate 402. An integrated heater coil 406 is located on island portion 404. A set of tethers 410, such as polyimide tethers, which have a low thermal conductivity, connect substrate 402 with island portion 404. The tethers 410 thermally isolate island portion 404 from substrate 402. A thermal metamaterial 414 is formed on at least one of tethers 410, as shown in FIG. 4.

The island portion 404 may also contain a temperature sensor for feedback control of heater coil 406. Alternatively, the temperature may be controlled by other mechanisms, such as by the temperature response of other components (e.g., a miniature laser, or an atomic gas cell).

Figure 5:
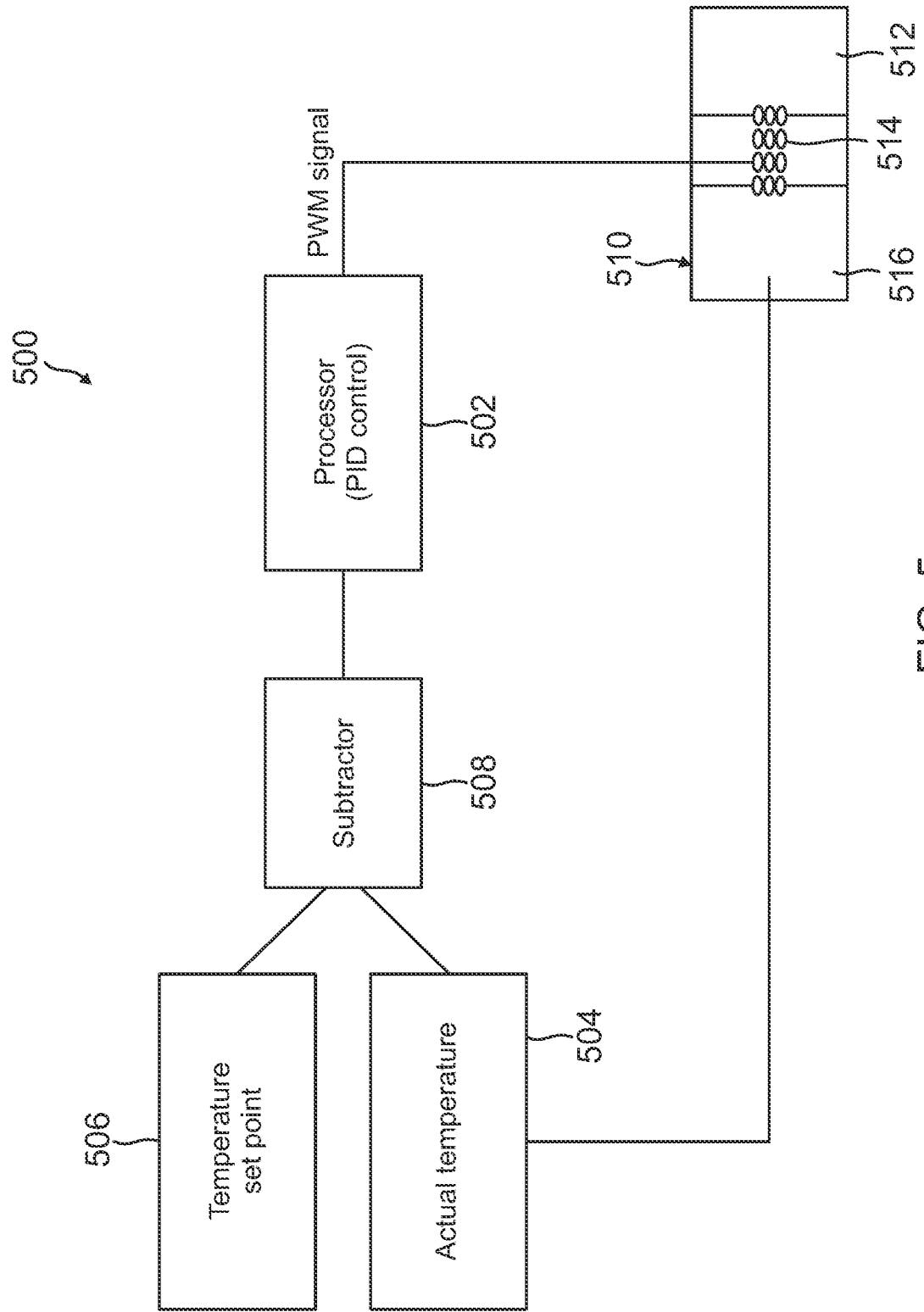
FIG. 5 is a block diagram of a variable temperature control system, which provides variable thermal conductivity for a thermal metamaterial, according to an exemplary embodiment.

As mentioned above, the thermal metamaterial can be implemented in various embodiments to have a variable thermal conductivity. FIG. 5 illustrates a variable temperature control system 500, which is operatively coupled to a thermal isolation scaffold 510. The thermal isolation scaffold 510 includes a thermal reservoir 512 such as a silicon substrate, a thermal metamaterial 514, and a thermally controlled region 516 such as a silicon island that includes an integrated heater coil. The variable temperature control system 500 is configured to provide thermal conductivity tuning of thermal metamaterial 514.

The variable temperature control system 500 includes a processor unit 502, such as a proportional-integral-derivative (PID) controller, which outputs a feedback signal, such as a PWM signal. A thermal sensor 504 is configured to measure the actual temperature of thermally controlled region 516. A temperature set point unit 506 is configured to provide a desired temperature set point for thermal metamaterial 514. A subtractor circuit 508, coupled to processor unit 502, is configured to receive temperature values from thermal sensor 504 and set point unit 506.

During operation, subtractor circuit 508 compares a temperature value from set point unit 506 with an actual temperature value from thermal sensor 504. The subtractor circuit 508 outputs a differential temperature value to processor unit 502, which outputs the feedback signal (PWM signal) based on the differential temperature value. The feedback signal is sent to thermal metamaterial 514, or to both metamaterial 514 and the integrated heater coil. The feedback signal allows for intermittent connection to provide for continuous tuning of the thermal conductivity of thermal metamaterial 514.

Example Embodiments

Example 1 includes a device comprising: at least one micro-electro-mechanical systems (MEMS) thermal switch, comprising: a substrate layer including a first material having a first thermal conductivity; a thermal bus over a first portion of the substrate layer, the thermal bus including a second material having a second thermal conductivity that is higher than the first thermal conductivity; an insulator layer over a second portion of the substrate layer, the insulator layer including a third material that is different from the first and second materials, the insulator layer including a first portion having a first height, and a second portion having a second height that is less than the first height; and a thermal pad supported by the first portion of the insulator layer, the thermal pad including the second material and having an overhang portion, wherein the overhang portion is located over a portion of the thermal bus; wherein when a voltage is applied to the thermal pad, an electrostatic interaction occurs between the thermal pad and the thermal bus to cause a deflection of the overhang portion of the thermal pad toward the thermal bus, thereby providing thermal conductivity between the thermal pad and the thermal bus.

Example 2 includes the device of Example 1, wherein the first material comprises a polyimide, porous silicon, a glass, or combinations thereof.

Example 3 includes the device of any of Examples 1-2, wherein the second material is a metal comprising copper, gold, aluminum, or combinations thereof.

Example 4 includes the device of any of Examples 1-3, wherein the third material comprises silicon dioxide, silicon nitride, or combinations thereof.

Example 5 includes the device of any of Examples 1-4, further comprising a voltage source electrically coupled to the thermal pad through one or more metallic contacts.

Example 6 includes the device of Example 5, further comprising a pair of support sections coupled over the thermal pad, the support sections including the first material, wherein the metallic contacts are coupled to the support sections.

Example 7 includes the device of any of Examples 1-6, further comprising a scaffold that supports the at least one MEMS thermal switch, wherein the scaffold is thermally isolated from a surrounding environment.

Example 8 includes the device of Example 7, wherein the scaffold comprises: a substrate; an island portion thermally isolated from and surrounded by the substrate; an integrated heater coil located on the island portion; and a set of tethers that connect the substrate with the island portion, wherein the tethers are configured to thermally isolate the island portion from the substrate.

Example 9 includes the device of Example 8, wherein the at least one MEMS thermal switch is located on at least one of the tethers.

Example 10 includes the device of any of Examples 8-9, wherein the substrate and the island portion are composed of silicon; and the tethers ae composed of a polyimide.

Example 11 includes a micro-electro-mechanical systems (MEMS) device, comprising: a thermal isolation scaffold; a metamaterial comprising an array of MEMS thermal switches on the thermal isolation scaffold, each of the MEMS thermal switches comprising: a substrate layer including a first material having a first thermal conductivity; a thermal bus over a first portion of the substrate layer, the thermal bus including a second material having a second thermal conductivity that is higher than the first thermal conductivity; an insulator layer over a second portion of the substrate layer, the insulator layer including a third material that is different from the first and second materials, the insulator layer including a first portion having a first height, and a second portion having a second height that is less than the first height; and a thermal pad supported by the first portion of the insulator layer, the thermal pad including the second material and having an overhang portion, wherein the overhang portion is located over a portion of the thermal bus; and a voltage source electrically coupled to each thermal pad of each of the MEMS thermal switches; wherein when a voltage is applied from the voltage source, an electrostatic interaction occurs in the MEMS thermal switches, between each thermal pad and each thermal bus, to cause a deflection of the overhang portion of the thermal pad toward the thermal bus, thereby providing thermal conductivity between the thermal pad and the thermal bus.

Example 12 includes the MEMS device of Example 11, wherein the thermal isolation scaffold comprises: a substrate; an island portion thermally isolated from and surrounded by the substrate; an integrated heater coil located on the island portion; and a set of tethers that connect the substrate with the island portion, wherein the tethers are configured to thermally isolate the island portion from the substrate.

Example 13 includes the MEMS device of Example 12, wherein the array of MEMS thermal switches is located on at least one of the tethers.

Example 14 includes the MEMS device of any of Examples 12-13, wherein the first material comprises a polyimide, porous silicon, a glass, or combinations thereof the second material comprises copper, gold, aluminum, or combinations thereof and the third material comprises silicon dioxide, silicon nitride, or combinations thereof.

Example 15 includes the MEMS device of any of Examples 12-14, further comprising a variable temperature control system operatively coupled to the metamaterial, wherein the variable temperature control system is configured to provide a variable thermal conductivity for the metamaterial.

Example 16 includes the MEMS device of Example 15, wherein the variable temperature control system comprises: a processor unit operatively coupled to the metamaterial; a thermal sensor operatively coupled to the metamaterial, the thermal sensor configured to measure the actual temperature of the metamaterial; a temperature set point unit configured to provide a desired temperature set point for the metamaterial; and a subtractor circuit operatively coupled to the processor unit, the subtractor circuit configured to receive respective temperature values from the thermal sensor and the temperature set point unit; wherein the subtractor circuit is operative to compare the temperature values from the thermal sensor and the temperature set point unit, and output a differential temperature value to the processor unit; wherein the processor unit is operative to output a feedback, based on the differential temperature value, to the metamaterial, or to both the metamaterial and the integrated heater coil; wherein the feedback signal is operative to allow for intermittent connection to provide for continuous tuning of the thermal conductivity of the metamaterial.

Example 17 includes the MEMS device of Example 16, wherein the processor unit comprises a proportional-integral-derivative (PID) controller, which is operative to output the feedback signal as a pulse width modulation (PWM) signal.

Example 18 includes a method of fabricating a micro-electro-mechanical systems (MEMS) device including a thermal metamaterial, the method comprising: providing a substrate layer; forming a first polymer layer on the substrate layer; etching the substrate layer to create one or more substrate island portions that are bridged by the first polymer layer; depositing a first metal layer on the first polymer layer; patterning the first metal layer to produce a thermal bus that protrudes from the first polymer layer; depositing an insulator layer over the thermal bus and exposed portions of the first polymer layer; depositing a second metal layer over the insulator layer; patterning the second metal layer to produce a set of electrode pads that protrude from the insulator layer; partially etching the insulator layer to expose portions of an upper surface of the first polymer layer, while leaving a remaining portion of the insulator layer around the electrode pads; forming a second polymer layer over the electrode pads, the remaining portion of the insulator layer, and the first polymer layer; etching the second polymer layer over the electrode pads; depositing a third metal layer over the second polymer layer and the electrode pads to create a set of upper contacts; etching the third metal layer along with portions of the second polymer layer to create an upper metal grid pattern; and partially etching the remaining portion of the insulator layer to undercut the electrode pads and produce therefrom a set of thermal pads separated from the thermal bus.

Example 19 includes the method of Example 18, wherein the substrate layer comprises silicon; the polymer layers comprise a polyimide; the metal layers comprise copper, gold, aluminum, or combinations thereof; and the insulator layer comprises silicon dioxide, silicon nitride, or combinations thereof.

Example 20 includes the method of any of Examples 18-19, wherein the substrate layer, the island portions, and the first polymer layer are formed as part of a thermal isolation scaffold.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:
1. A device comprising:
   at least one micro-electro-mechanical systems (MEMS) thermal switch, comprising:
      a substrate layer including a first material having a first thermal conductivity;
      a thermal bus over a first portion of the substrate layer, the thermal bus including a second material having a second thermal conductivity that is higher than the first thermal conductivity;
an insulator layer over a second portion of the substrate layer, the insulator layer including a third material that is different from the first and second materials, the insulator layer including a first portion having a first height, and a second portion having a second height that is less than the first height; and
a thermal pad supported by the first portion of the insulator layer, the thermal pad including the second material and having an overhang portion, wherein the overhang portion is located over a portion of the thermal bus;
wherein when a voltage is applied to the thermal pad, an electrostatic interaction occurs between the thermal pad and the thermal bus to cause a deflection of the overhang portion of the thermal pad toward the thermal bus, thereby providing thermal conductivity between the thermal pad and the thermal bus.

2. The device of claim 1, wherein the first material comprises a polyimide, porous silicon, a glass, or combinations thereof.

3. The device of claim 1, wherein the second material is a metal comprising copper, gold, aluminum, or combinations thereof.

4. The device of claim 1, wherein the third material comprises silicon dioxide, silicon nitride, or combinations thereof.

5. The device of claim 1, further comprising:
a voltage source electrically coupled to the thermal pad through one or more metallic contacts.

6. The device of claim 5, further comprising a pair of support sections coupled over the thermal pad, the support sections including the first material, wherein the metallic contacts are coupled to the support sections.

7. The device of claim 1, further comprising:
a scaffold that supports the at least one MEMS thermal switch, wherein the scaffold is thermally isolated from a surrounding environment.

8. The device of claim 7, wherein the scaffold comprises:
a substrate;
an island portion thermally isolated from and surrounded by the substrate;
an integrated heater coil located on the island portion; and
a set of tethers that connect the substrate with the island portion, wherein the tethers are configured to thermally isolate the island portion from the substrate.

9. The device of claim 8, wherein the at least one MEMS thermal switch is located on at least one of the tethers.

10. The device of claim 8, wherein:
the substrate and the island portion are composed of silicon; and
the tethers ae composed of a polyimide.

11. A micro-electro-mechanical systems (MEMS) device, comprising:
a thermal isolation scaffold;
a metamaterial comprising an array of MEMS thermal switches on the thermal isolation scaffold, each of the MEMS thermal switches comprising:
a substrate layer including a first material having a first thermal conductivity;
a thermal bus over a first portion of the substrate layer, the thermal bus including a second material having a second thermal conductivity that is higher than the first thermal conductivity;
an insulator layer over a second portion of the substrate layer, the insulator layer including a third material that is different from the first and second materials, the insulator layer including a first portion having a first height, and a second portion having a second height that is less than the first height; and
a thermal pad supported by the first portion of the insulator layer, the thermal pad including the second material and having an overhang portion, wherein the overhang portion is located over a portion of the thermal bus; and
a voltage source electrically coupled to each thermal pad of each of the MEMS thermal switches;
wherein when a voltage is applied from the voltage source, an electrostatic interaction occurs in the MEMS thermal switches, between each thermal pad and each thermal bus, to cause a deflection of the overhang portion of the thermal pad toward the thermal bus, thereby providing thermal conductivity between the thermal pad and the thermal bus.

12. The MEMS device of claim 11, wherein the thermal isolation scaffold comprises:
a substrate;
an island portion thermally isolated from and surrounded by the substrate;
an integrated heater coil located on the island portion; and
a set of tethers that connect the substrate with the island portion, wherein the tethers are configured to thermally isolate the island portion from the substrate.

13. The MEMS device of claim 12, wherein the array of MEMS thermal switches is located on at least one of the tethers.

14. The MEMS device of claim 12, wherein:
the first material comprises a polyimide, porous silicon, a glass, or combinations thereof;
the second material comprises copper, gold, aluminum, or combinations thereof; and
the third material comprises silicon dioxide, silicon nitride, or combinations thereof.

15. The MEMS device of claim 12, further comprising:
a variable temperature control system operatively coupled to the metamaterial, wherein the variable temperature control system is configured to provide a variable thermal conductivity for the metamaterial.

16. The MEMS device of claim 15, wherein the variable temperature control system comprises:
a processor unit operatively coupled to the metamaterial;
a thermal sensor operatively coupled to the metamaterial, the thermal sensor configured to measure the actual temperature of the metamaterial;
a temperature set point unit configured to provide a desired temperature set point for the metamaterial; and
a subtractor circuit operatively coupled to the processor unit, the subtractor circuit configured to receive respective temperature values from the thermal sensor and the temperature set point unit;
wherein the subtractor circuit is operative to compare the temperature values from the thermal sensor and the temperature set point unit, and output a differential temperature value to the processor unit;
wherein the processor unit is operative to output a feedback, based on the differential temperature value, to the metamaterial, or to both the metamaterial and the integrated heater coil;
wherein the feedback signal is operative to allow for intermittent connection to provide for continuous tuning of the thermal conductivity of the metamaterial.

17. The MEMS device of claim 16, wherein the processor unit comprises a proportional-integral-derivative (PID) controller, which is operative to output the feedback signal as a pulse width modulation (PWM) signal.

\* \* \* \* \*